United States Patent [19]

Ihm

[11] Patent Number: 6,160,502

[45] Date of Patent: Dec. 12, 2000

[54] INTERPOLATION DIGITAL FILTER FOR AUDIO CODEC

[75] Inventor: Jae-Yong Ihm, Seoul, Rep. of Korea

[73] Assignee: Hyundai Electronics Industries Co., Ltd., Ichon-shi, Rep. of Korea

[21] Appl. No.: 09/197,471

[22] Filed: Nov. 23, 1998

[30] Foreign Application Priority Data

Jan. 26, 1998 [KR] Rep. of Korea ................. 98-2416

[51] Int. Cl.[7] .................................................. H03M 7/00
[52] U.S. Cl. ........................... 341/61; 341/155; 375/122
[58] Field of Search ........................... 341/61, 144, 155; 375/122

[56] References Cited

U.S. PATENT DOCUMENTS

| | | | |
|---|---|---|---|
| 4,588,979 | 5/1986 | Adams | 341/155 |
| 4,870,661 | 9/1989 | Yamada et al. | 341/61 |
| 5,126,737 | 6/1992 | Torii | 341/61 |
| 5,598,158 | 1/1997 | Linz | 341/143 |

*Primary Examiner*—Michael Tokar
*Assistant Examiner*—Jean Bruner Jeanglaude
*Attorney, Agent, or Firm*—Fleshner & Kim, LLP

[57] ABSTRACT

An interpolation digital filter for an audio CODEC uses a bit serial method for an audio CODEC system with a clock signal of 256 FS. The interpolation digital filter converts a 32-bits data signal of sampling frequency of 1 FS to a 32-bit data signal of the sampling frequency of 8 FS using a clock signal of 256 FS in a filter unit. Therefore, the present invention reduces the size of the system and reduces the cost.

9 Claims, 6 Drawing Sheets

FIG.3
BACKGROUND ART

| $t(\frac{1}{512FS})$ SIGNAL | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| C1 | L1 | R1 | | | | | | | | | | | | | | | L2 | R2 |
| C3 | L21 | R21 | | | L32 | R32 | | | L22 | R22 | | | | | | | L23 | R23 |
| C5 | L31 | R31 | | | | | | | L33 | R33 | | | L34 | R34 | | | L35 | R35 |
| DOUT | L41 | R41 | L42 | R42 | L43 | R43 | L44 | R44 | L45 | R45 | L46 | R46 | L47 | R47 | L48 | R48 | L49 | R49 |

FIG. 6

| t(1/512FS) | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| t'(1/256FS) | 1' | | 2' | | 3' | | 4' | | 5' | | 6' | | 7' | | 8' | | 9' | | 10' |
| D1 | L1 | | R1 | | | | | | | | | | | | | | L2 | | R2 |
| D3 | L21 | | R21 | | L32 | | R32 | | L22 | | R22 | | L34 | | R34 | | L23 | | R23 |
| D5 | L31 | | R31 | | L32 | | R32 | | L33 | | R33 | | L34 | | R34 | | L35 | | R35 |
| D8 | X | | L42 | | R42 | | L44 | | R44 | | L46 | | R46 | | L48 | | R48 | | L410 |
| D10 | L41 | | R41 | | L43 | | R43 | | L45 | | R45 | | L47 | | R47 | | L49 | | R49 |
| DOUT | X | L41 | R41 | L42 | R42 | L43 | R43 | L44 | R44 | L45 | R45 | L46 | R46 | L47 | R47 | L48 | R48 | L49 | R49 |

INTERPOLATION DIGITAL FILTER FOR AUDIO CODEC

BACKGROUND OF THE INVENTION

1. Field of the Invention

The present invention relates to an interpolation digital filter for an audio CODEC (coder and decoder), and in particular to an improved interpolation digital filter for an audio CODEC which is implemented by a bit serial method for an audio CODEC system with a clock signal of 256 FS.

2. Description of the Background Art

As shown in FIG. 1, the known audio CODEC interpolation digital filter includes a parallel/serial converter 101 for receiving a parallel data signal DIN and outputting a serial data signal C1, a first up-sampling unit 102 for receiving the serial data signal C1 and quantizing them with the two times sampling frequency and outputting a first sampling signal C2, a first digital filter 103 for filtering the first sampling signal C2 and outputting the first filtering signal C3, a second up-sampling unit 104 for outputting a second sampling signal C4 which is obtained by quantizing the first filtering signal C3 with the two times sampling frequency, a second digital filter 105 for filtering the second sampling signal C4 with four times sampling frequency and outputting a second filtering signal C5, and a filter unit 106 for receiving the second filtering signal C5 and outputting a parallel data signal DOUT. The above-described elements are connected in serial.

As shown in FIG. 2, the filter unit 106 includes a third up-sampling unit 201 for receiving the second filtering signal C5 and outputting a third sampling signal C6, a third digital filter 202 for receiving the third sampling signal C6 and outputting a third filtering signal C7, and a serial/parallel converter 203 for receiving the third filtering signal C7 and outputting the parallel data signal DOUT.

The third up-sampling unit 201 includes a multiplexer 2 for receiving the second filtering signal C5 at one input terminal outputting a third sampling signal C6, and a delay unit 4 for receiving the third sampling signal C6 and outputting an output signal C61 to the other input terminal of the multiplexer 2. The third sampling signal C6 comprises a twice delayed serial data signal type compared to the second filtering signal C5. As above described, the first and second up-sampling units 102 and 104 are similar to the third up-sampling unit 201.

The third digital filter 202 includes a first adaptor 6 for receiving the third sampling signal C6 and outputting a first adaptor output signal C71, a second adaptor 12 for receiving the third sampling signal C6 and outputting the second adaptor output signal C73, delay units 8 and 10 for delaying the third sampling signal C6 composed of stereosignals(left and right signals) by a switch SW1, which is connected with the first adaptor 6, similarly, delay units 14 and 16 for delaying the third sampling signal C6 with stereosignals (composing with left and right signals) by a switch SW2, which is connected with the second adaptor 12, a delay unit 18 for delaying a first adaptor output signal C71 from the first adaptor 6 for a predetermined time for thereby generating a delayed output signal C72, and an adder 20 for adding the delayed output signal C72 and the second adaptor output signal C73 and generating a third filtering signal C7. In addition, the first and second digital filters 103 and 105 are configured identically to the third digital filter 202, as above mentioned.

The operation of the known interpolation digital filter will now be explained with reference to FIG. 3.

FIG. 3 is a table illustrating a conversion process of a sampling data signal by the known interpolation digital filter and a process that a parallel data signal of 32 bits of the sampling frequency 8 FS is generated by quantizing and filtering the serial data signal of 32 bits several times.

As shown therein, the row denotes the sampling time t, and the column denotes an input/output signal from each block in the interpolation digital filter.

For the input data signal is a stereo signal (the left and right data signal indicating as LiRi where L=1, 2, ... ), when processing the parallel data signal of 32 bits of 1 Fs into a parallel data signal of 32 bits of 8 FS which comprises the quantization of an 8-times sampling frequency, the frequency of the clock signal should be supplied as 512 FS. In other words, since the sampling operation should be performed 8 times between the first input data signal L1R1 and the second input data signal L2R2, the time Tp between the sampling data signals is 32×2×8, i.e., 512 FS.

The serial data signal C1 from the parallel/serial converter 101 receiving a parallel data signal DIN is a type of the data signal sequence (L1R1, L2R2, ... ), and the first filtering signal C3 is a type of data signal sequence (L21R21, L22R22, ... ) which is obtained when the serial data signal sequence(L1R1, L2R2, ... ) is quantized with a two-times sampling frequency and filtered through the first upsampling unit 102 and the first digital filter 103. The second filtering signal C5 is a type of data signal sequence (L31R31, L32R32, L33R33, L34R34, L35R35, ... ) which is developed when the data signal sequence (L21R21, L22R22, ... ) is quantized with a two-times sampling frequency and filtered through the second up-sampling unit 104 and the second digital filter 105. As a result, the data signal sequence (L31R31, L32R32, L33R33, L34R34, L35R35, ... ) is a 32-bit data signal sequence of the 4 FS which is 4-times the serial data signal C1. Similarly, the parallel data signal DOUT is a type of data signal sequence (L41R41, L42R42, L43R43, L44R44, L45R45, L46R46, L47R47, L48R48, ... ) which is developed by up-sampling and filtering the data signal sequence(L31R31, L32R32, L33R33, L34R34, L35R35, ... ) of the 4 FS.

Therefore, the 32-bits data signal of the 1 FS is processed to the 32-bits data signal of the 8 FS. However, the above-described method is implemented by using a phase locked loop(PLL) with a clock signal of the 512 FS, the known interpolation digital filter is costly high and the size of it is increased.

SUMMARY OF THE INVENTION

Accordingly, it is an object of the present invention to provide an interpolation digital filter for an audio CODEC which overcomes the aforementioned problems encountered in the background art.

It is another object of the present invention to provide an interpolation digital filter for an audio CODEC which is capable of converting a 32-bits data signal of 1 FS to a 32-bits data signal of 8 FS with a clock signal of 256 FS.

To achieve the above objects, there is provided an interpolation digital filter for an audio CODEC which includes a parallel/serial converter for converting a parallel input data signal into a serial data signal, a first up-sampling unit for up-sampling the serial data signal and outputting a first sampling signal in which the number of the serial data signal is twice, a first digital filter for filtering the first sampling signal and outputting a first filtering signal, a second up-sampling unit for up-sampling the first filtering signal and outputting a second sampling signal in which the number of sampling the first filtering signal is increased, a second digital filter for filtering the second sampling signal and outputting a second filtering signal, and a filter for receiving the second filtering signal and outputting a parallel output signal in which the number of the second filtering signals is increased.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a table illustrating a data signal flow of FIG. 1;

FIG. 6 is a table illustrating a data signal flow of FIG. 5.

DETAILED DESCRIPTION OF THE PREFERRED EMBODIMENTS

The interpolation digital filter for an audio CODEC according to the present invention will now be explained with reference to the accompanying drawings.

Figure 1:
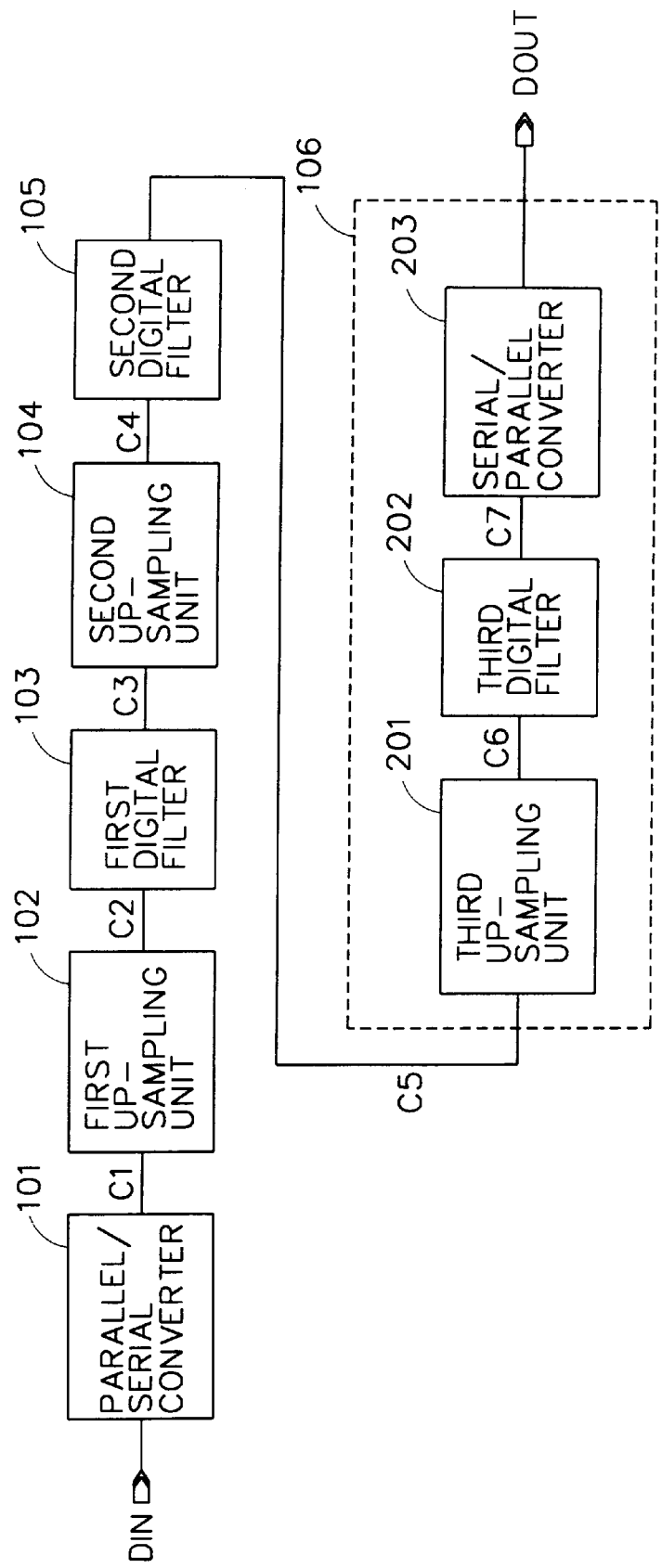
FIG. 1 is a block diagram illustrating a known interpolation digital filter for an audio CODEC.
Figure 2:
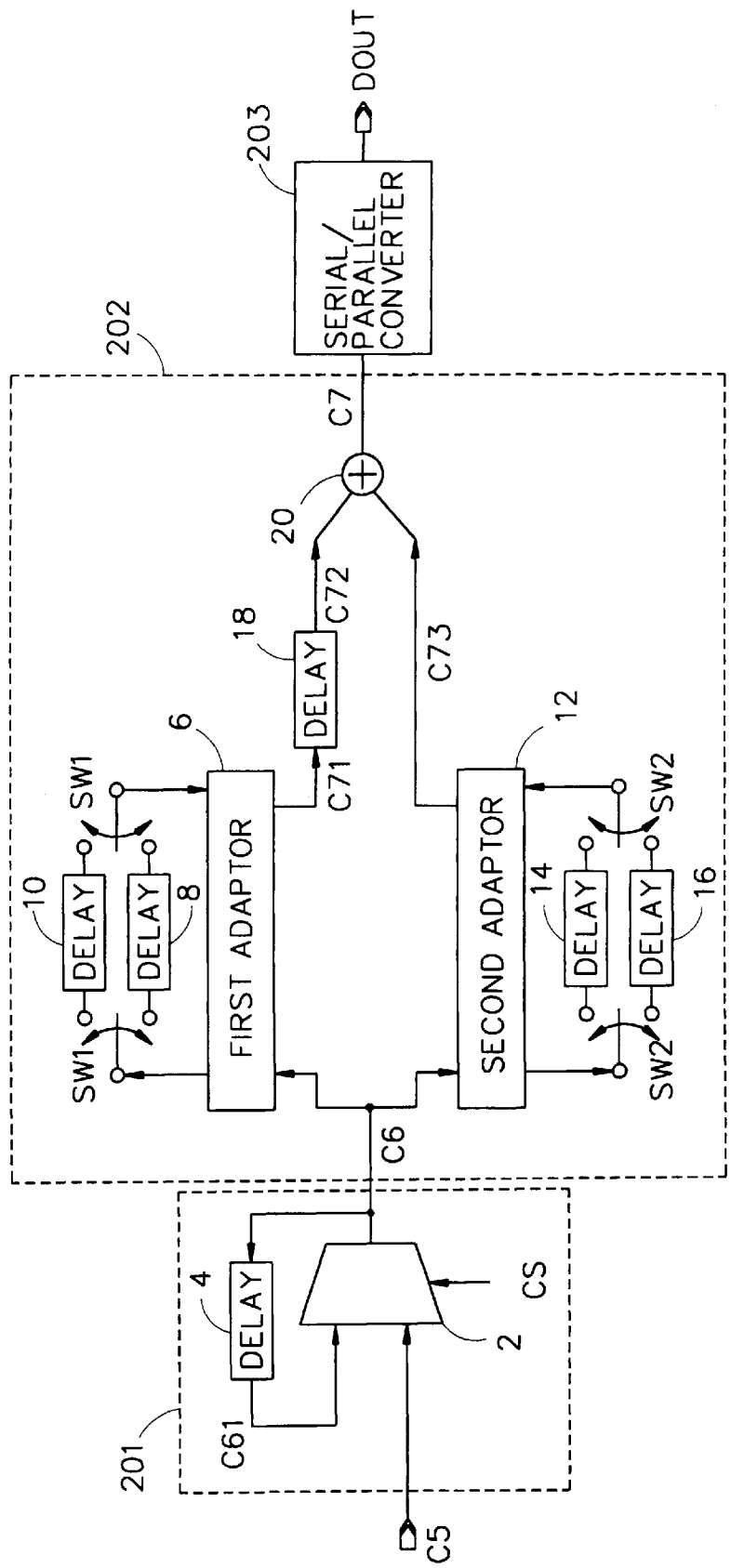
FIG. 2 is a detailed block diagram illustrating a filter unit of FIG. 1.
Figure 4:
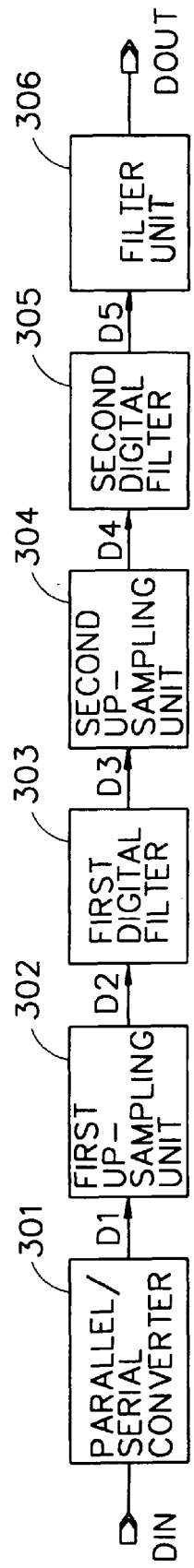
FIG. 4 is a block diagram illustrating an interpolation digital filter for an audio CODEC according to the present invention.

FIG. 4 illustrates an interpolation digital filter for an audio CODEC which includes a parallel/serial converter 301 for converting a parallel input data signal DIN into a serial data signal D1, a first up-sampling unit 302 for converting the serial data signal D1 and outputting a first sampling signal D2 which is a 2-times quantized data signal sequence compared of the serial data signal D1, a first digital filter 303 for filtering the first sampling signal D2 and outputting a first filtering signal D3, a second up-sampling unit 304 for receiving the first filtering signal D3 and outputting a second sampling signal D4 which is a 2-times quantized data signal sequence compared of the first sampling signal D3, a second digital filter 305 for filtering the second sampling signal D4 and outputting a second filtering signal D5, and a filter unit 306 for receiving the second filtering signal D5 and outputting an parallel output data signal DOUT.

The parallel/serial converter 301 is constituted identical to the known parallel/serial converter 101, and the first and second up-sampling units 302 and 304 are identical with the known up-sampling units 102, 104 and 201, and the first and second digital filters 303 and 305 are the same as the known digital filters 103, 105 and 202.

Figure 5:
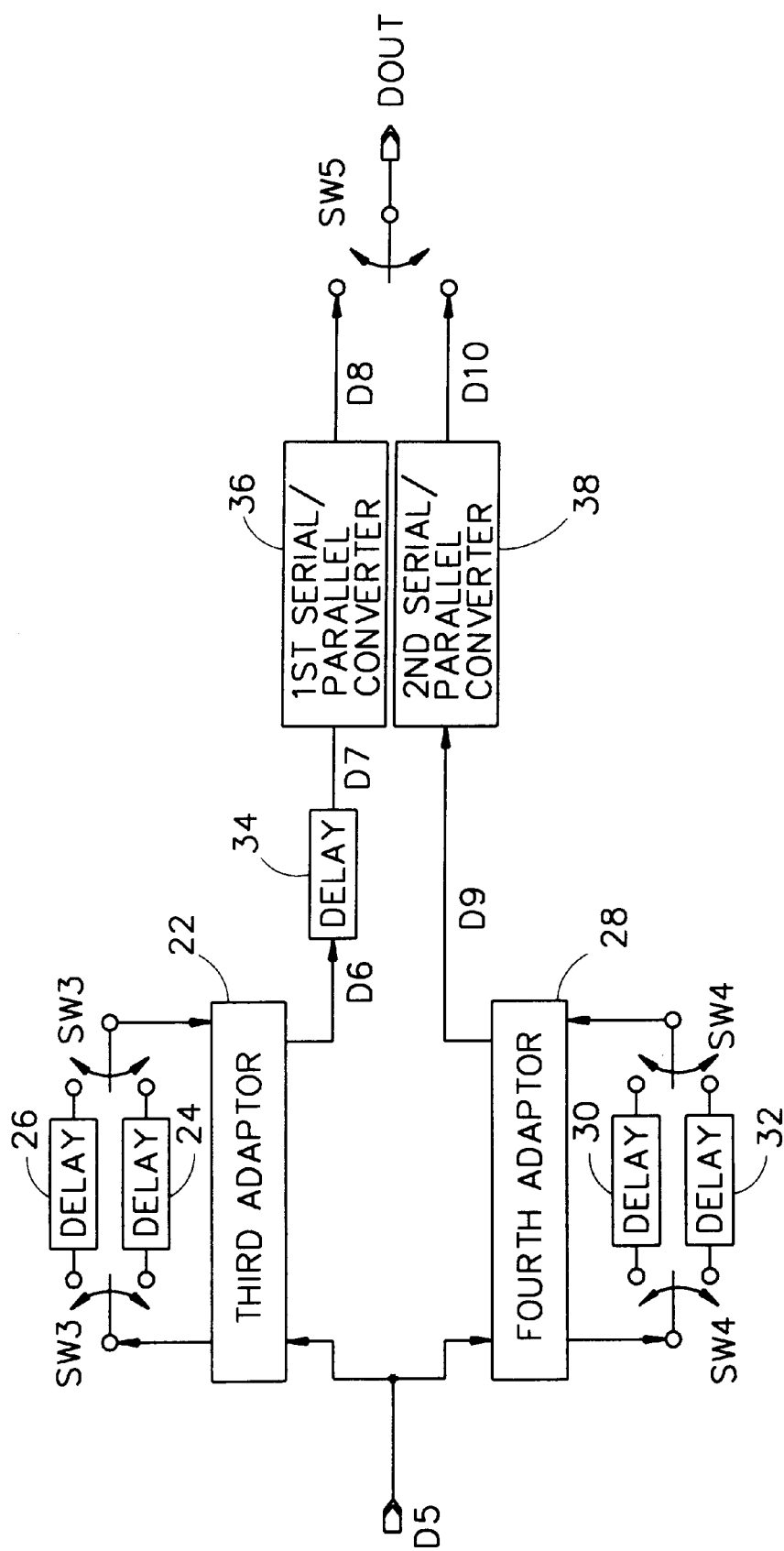
FIG. 5 is a detailed block diagram illustrating a filter unit of FIG. 4.

FIG. 5 illustrates the detailed construction of the filter unit 306 of FIG. 4, which is used instead of the filter unit 106 in the known interpolation digital filter. There are provided a third adaptor 22 for receiving the second filtering signal D5 from the second digital filter 305 and outputting a third adaptor output signal D6, a fourth adaptor 28 for receiving the second filtering signal D5 and outputting a fourth adaptor output signal D9, delay units 24 and 26 connected with the third adaptor 22 for delaying the second filtering signal D5 composing with a stereo signal(left and right signals) by a switch SW3, which is connected with the third adaptor 22, delay units 30 and 32 connected with the fourth adaptor 28 for delaying the second filtering signal D5 composing with a stereo signal(left and right signals) by a switch SW4, which is connected with the fourth adaptor 28, a delay unit 34 for delaying the third adaptor output signal D6 and outputting a delay signal D7, a first serial/parallel converter 36 for converting the delay signal D7 into a first parallel data signal D8, a second serial/parallel converter 38 for converting the fourth adaptor output signal D9 into a second parallel data signal D10, and a switch SW5 for alternately connecting the first parallel data signal D8 and the second parallel data signal D10 and developing a parallel output data signal DOUT.

The operation of the interpolation digital filter according to the present invention will now be explained with reference to FIG. 6.

FIG. 6 illustrates a table for explaining a conversion process of a sampling data signal by the interpolation digital filter and a process in which the 32-bits parallel data signal of 1 FS is converted into the 32-bits parallel data signal of 8 FS which comprises a quantized data signal as a 8-times sampling frequency compared of the sampling frequency of the serial data signal D1.

As shown therein, the row denotes a sampling time t indicating the clock signal of 512 FS and a sampling time t' indicating the clock signal of 256 FS, and the column denotes an input/output signal from each block in the interpolation digital filter.

The parallel/serial converter 301 converting a parallel input data signal DIN to a serial data signal D1 which is a type of data signal sequence(L1R1, L2R2, ...) at every 1/32 seconds. The data signal sequence (L1R1, L2R2, ...) passes through the first up-sampling unit 302 and the first digital filter 303 and becomes the first filtering signal D3 which is a type of data signal sequence (L21R21, L22R22, ...) of the 2 FS which is two-times compared of the serial data signal D1 at every 1/64 seconds. Continuously, the second up-sampling unit 304 and the second digital filter 305 receiving the data signal sequence (L21R21, L22R22, ...) of the 2 FS develops the data signal sequence (L31R31, L32R32, L33R33, ...) of the 4 FS which is four-times compared of the serial data signal D1 at every 1/128 seconds.

In the filter 306, the data signal sequence (L31R31, L32R32, L33R33, L34R34, ...) of the 4 FS is divided into a first parallel data signal D8 which is a type of data signal sequence (x, L42R42, L44R44, L48R48, ...) of the 4 FS from the first serial/parallel converter 36 and a second parallel data signal D10 which is a type of data signal sequence (L41R41, L43R43, L45R45, L47R47, L49R49, ...) of the 4 FS from the second serial/parallel converter 38, respectively. Then, the switch SW5 operating with a clock signal of 256 FS alternately switches the first and second parallel data signal D8 and D10 from the serial/parallel converter 36 and 38, for thereby generating an output signal DOUT to a data signal sequence (X L41 R41 L42 R42 L43 R43 L44R44L45R45L46R46L47R47L48R48 ...) of the 8 FS.

Therefore, according to the present invention the interpolation digital filter converts the 32-bits data of 1 FS to the 32-bits data of 8Fs using a switch SW5 which is operated by the clock signal of 256 FS, instead of the PLL operating at the clock signal of 512 FS.

In addition, it is possible to reduce the fabrication cost of the system.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. An interpolation digital filter for an audio CODEC (coder and decoder), comprising:
   a parallel/serial converter for receiving a parallel input data signal and outputting a serial data signal;
   a first up-sampling unit for up-sampling the serial data signal and outputting a first sampling signal;
   a first digital filter for filtering the first sampling signal and outputting a first filtering signal;
   a second up-sampling unit for up-sampling the first filtering signal and outputting a second sampling signal;
   a second digital filter for filtering the second sampling signal and outputting a second filtering signal; and
   a filter unit for receiving the second filtering signal and outputting a parallel output data signal, wherein said first and second up-sampling units operate under a first clock frequency and the filter unit operates under a second clock frequency, the first and second frequencies being different from each other.

2. The filter of claim 1, whe rein said second clock frequency is one-half (½) the frequency of the first clock signal.

3. The filter of claim 1, wherein said up-sampling comprises that the sampling number of the respective outputting signals from said each up-sampling units is twice than that of the respective inputting signals into said each up-sampling units.

4. The filter of claim 1, wherein said filtering signals are a serial data signal which is a stereo data signal including a left and a right data signals.

5. The filter of claim 1, wherein said filter unit includes:
   a first adaptor having a first plurality of delay units;
   a first switch for alternatively switching the first plurality delay units to the first adaptor and transferring the second filtering signal;
   a delay unit for delaying a first adaptor output signal and outputting a delay signal;
   a first serial/parallel converter for receiving the delay signal and outputting a first parallel data signal;
   a second adaptor having a second plurality of delay units;
   a second switch for alternately switching the second plurality of delay units to the second adaptor and transferring the second filtering signal;
   a second serial/parallel converter for receiving the second adaptor output signal and outputting a second parallel data signal; and
   a third switch for switching the first parallel data signal and the second parallel data signal and forming a parallel output data signal.

6. The filter of claim 5, wherein said first and said second serial/parallel converters are connected with more than one delay unit, respectively.

7. The filter of claim 5, wherein the same sampling frequency data signals comprise said second filtering signal and said first and second parallel data signals, respectively.

8. The filter of claim 5, wherein said third switch for switching the first and the second parallel data signals generates the twice sampling data signal compared of the sampling number of the first and the second parallel data signals.

9. The filter of claim 8, wherein said twice sampling data signal comprises the parallel output data signal.

* * * * *